United States Patent
Lopatin et al.

(10) Patent No.: US 6,479,902 B1
(45) Date of Patent: Nov. 12, 2002

(54) SEMICONDUCTOR CATALYTIC LAYER AND ATOMIC LAYER DEPOSITION THEREOF

(75) Inventors: Sergey D. Lopatin, Santa Clara, CA (US); Carl J. Galewski, Aromas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 55 days.

(21) Appl. No.: 09/609,013

(22) Filed: Jun. 29, 2000

(51) Int. Cl.⁷ .............................. H01L 29/40
(52) U.S. Cl. ..................................... 257/774
(58) Field of Search .................. 257/774; 438/678, 438/640

(56) References Cited

U.S. PATENT DOCUMENTS

| | | | |
|---|---|---|---|
| 5,169,680 A | 12/1992 | Ting et al. | 427/96 |
| 5,695,810 A | 12/1997 | Dubin et al. | 427/98 |
| 6,197,688 B1 * | 3/2001 | Simpson | 438/678 |
| 6,211,071 B1 * | 4/2001 | Lukane et al. | 438/640 |
| 6,221,757 B1 * | 4/2001 | Schmidbauer et al. | 438/625 |

OTHER PUBLICATIONS

Per Martensson and Jan–Otto Carlsson, "Atomic Layer Epitaxy of Copper", *J. Electrochem. Soc.*, vol. 145 No. 8, Aug. 1998, pp. 2923–2931.

Milan Paunovic and Mordechay Schlesinger. *Fundamentals of Electrochemical Deposition*, John Wiley & Sons, Inc. © 1998, pp. 148–149.

S.M. Rossnagel and H. Kim, "From PVD to CVD to ALD for Interconnects and Related Applications", IEEE 2001 International Interconnect Technology Conference, Jun. 4–6, 2001. pp. 3–5.

* cited by examiner

Primary Examiner—Nathan J. Flynn
Assistant Examiner—Leonardo Andujar
(74) Attorney, Agent, or Firm—Mikio Ishimaru

(57) ABSTRACT

A semiconductor and manufacturing method is provided for device interconnects with a catalytic layer of copper, palladium, nickel, cobalt, silver, or other catalytic material deposited in a atomic layer by atomic layer epitaxy on a barrier layer of tantalum, titanium, tungsten, their nitrides, or a compound thereof between the barrier layer and an electroless seed layer on which conductive channel and via material is deposited.

12 Claims, 2 Drawing Sheets

SEMICONDUCTOR CATALYTIC LAYER AND ATOMIC LAYER DEPOSITION THEREOF

TECHNICAL FIELD

The present invention relates generally to semiconductors and more specifically to deposition of seed layers used in semiconductor processing.

BACKGROUND ART

In the manufacture of integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metallization process. The elimination of metal etch steps is important as the semiconductor industry moves from aluminum to other metallization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper. A thin adhesion layer formed of an adhesion material, such as titanium, is first deposited on the dielectrics or vias to ensure good adhesion and good electrical contact of subsequently deposited "barrier" layers to underlying doped regions and/or conductive channels. Adhesion barrier layer stacks formed of adhesion/barrier materials such as tantalum/tantalum nitride (Ta/TaN) and titanium/titanium nitride (Ti/TiN) have been found to be useful as adhesion/barrier material combination for copper interconnects.

After deposition of the barrier layer, a seed layer of conductive material, such as copper, is deposited by an ion metal plasma (IMP) deposition or an electroless plating process. This seed layer is subsequently used as one electrode in an electroplating process which deposits the conductive material which completely fills the channels and vias.

As the size of the channels and vias decrease, it has become increasingly difficult to form a seed layer which is sufficiently thin to provide uniform coverage of the barrier layer but which is thick enough to avoid having openings where the seed layer is not deposited. A solution to this problem has been long sought but has eluded those skilled in the art.

DISCLOSURE OF THE INVENTION

The present invention provides a semiconductor having device interconnects with a catalytic layer deposited in an atomic layer on a barrier layer between the barrier layer and a seed layer on which conductive channel and via material is deposited. The atomic layer provides a high aspect ratio channel and via conformal catalytic layer, which is extremely thin and may be discontinuous.

The present invention provides a semiconductor having device interconnects with a catalytic layer of copper, palladium, nickel, cobalt, silver, or other catalytic material deposited in a atomic layer on a barrier layer of tantalum, titanium, tungsten, their nitrides, or a compound thereof between the barrier layer and a seed layer on which conductive channel and via material is deposited. The atomic layer catalytic material provides good barrier and seed layer adhesion, a strong interface, and enhanced electro migration performance.

The present invention provides a method of manufacturing semiconductor device interconnects with a catalytic layer deposited by atomic layer deposition on a barrier layer.

The catalytic layer provides a base for electroless deposition of a conductive seed layer on which conductive channel and via material is deposited by electroplating using the seed layer as an electrode. The atomic layer deposition provides a conformal catalytic layer, which is extremely thin and may be discontinuous, for high aspect ratio channels and vias.

The present invention provides a method of manufacturing semiconductor device interconnects with a catalytic layer of copper, palladium, nickel, cobalt, silver, or other catalytic material deposited by atomic layer deposition on a barrier layer of tantalum, titanium, tungsten, their nitrides, or a compound thereof. The catalytic layer provides a base for electroless deposition of a conductive seed layer on which conductive channel and via material is deposited by electroplating using the seed layer as an electrode. The atomic layer catalytic material provides good barrier and seed layer adhesion, a strong interface, and enhanced electro migration performance.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
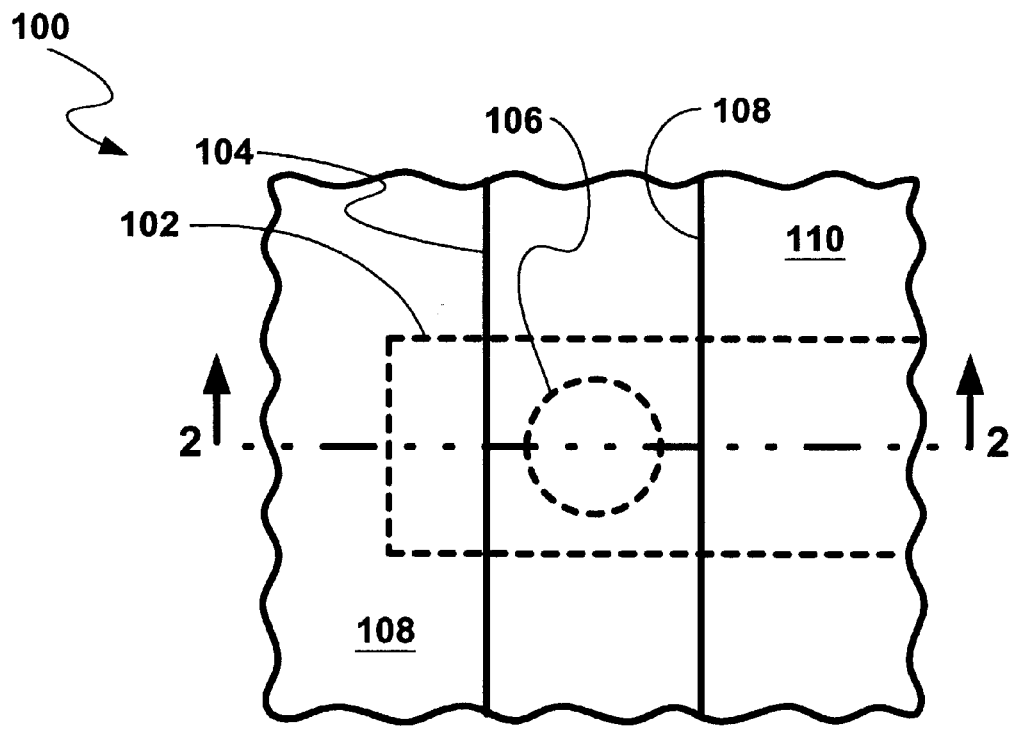
FIG. 1 (PRIOR ART) is a plan view of aligned channels with a connecting via.

Referring now to FIG. 1, therein is shown a plan view of a pair of semiconductor interconnect channels of a conductive material, such as aluminum, copper, tungsten or polysilicon, disposed in a dielectric, such as silicon oxide or silicon nitride, over a production semiconductor wafer 100 of a material such as silicon. A first channel 102 is shown disposed below a second channel 104 which extends substantially perpendicular to the first channel 102 in the plan view. A via 106 is a part of the second channel 104 and connects the first channel 102 to the second channel 104. The second channel 104 and the via 106 are formed by filling an opening 108 disposed in a second channel dielectric layer 110 with conductive material.

Figure 2:
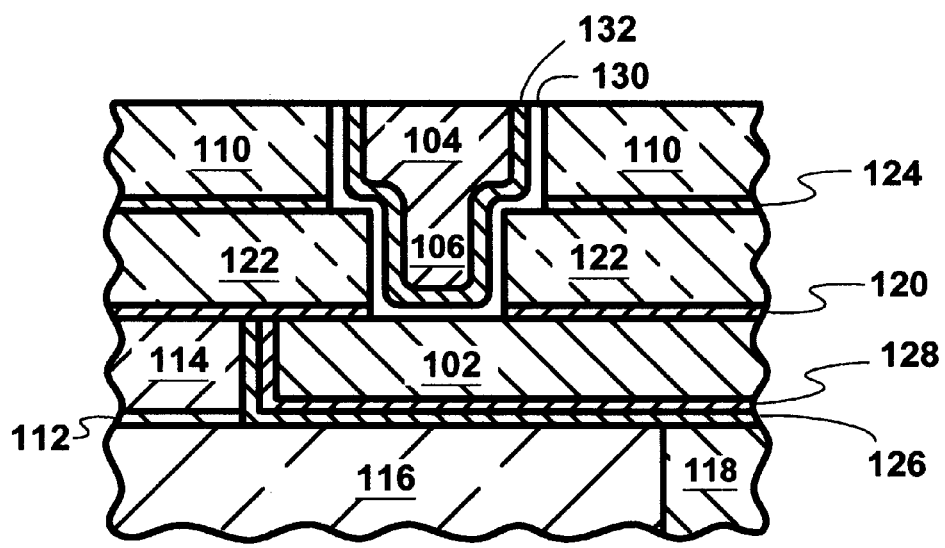
FIG. 2 (PRIOR ART) is a cross-section of FIG. 1 along line 2—2.

Referring now to FIG. 2, therein is shown a cross-section of FIG. 1 along 2—2. The first channel 102 of conductive material is disposed in a first dielectric etch stop layer 112 and a first channel dielectric layer 114. While metal contacts generally connect the first channel 102 to various semiconductor devices (not shown), in FIG. 2, the first channel 102 is shown in contact with a polysilicon gate 116 and a device dielectric layer 118 of a semiconductor device on an integrated circuit chip (not shown). The first channel 102 and the second channel 104 are in horizontal planes separated vertically by a via dielectric etch stop layer 120, a via dielectric layer 122, and a second channel dielectric layer 124.

Also shown disposed around the first channel 102 are a barrier layer 126, which could optionally be a combined adhesion and barrier layer, and a seed layer 128, and around the second channel 104 and the via 106 is a barrier layer 130, which could also optionally be a combined adhesion and barrier layer, and a seed layer 132. The barrier layers are used to prevent diffusion of the conductive materials into the adjacent areas of the semiconductor. The seed layers form electrodes on which the conductive material which makes up the channels are deposited.

Figure 3:
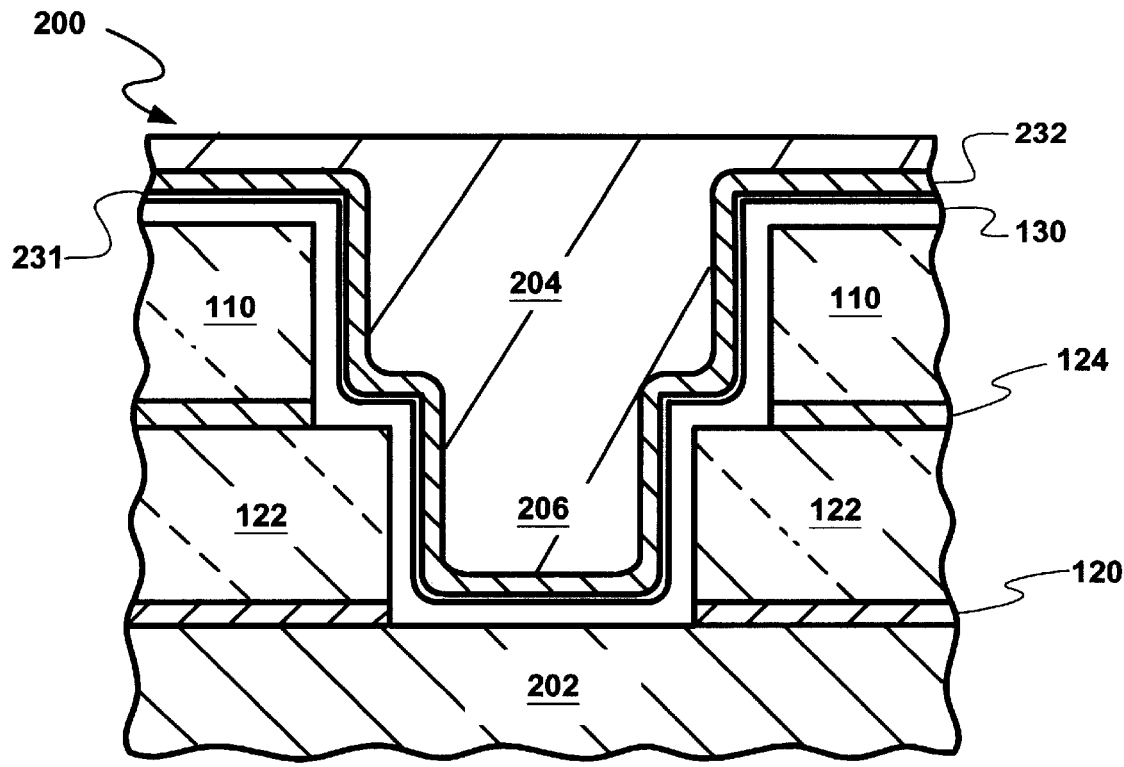
FIG. 3 is a close-up cross-section of FIG. 2 showing deposition of materials in a channel and via according to the present invention.

Referring now to FIG. 3, therein is shown the close-up cross-section similar to that shown in FIG. 2 of a semiconductor wafer 200 of the present invention. For convenience of illustration, like reference numerals are used in FIG. 3 to denote like elements already described in FIG. 2. FIG. 3 shows a first channel 202 which is manufactured according to the present invention which is described in greater detail for a second channel 204. FIG. 3 shows the barrier layer 130 after the deposition on the first channel 202 and in the via dielectric layer 122 and the second channel dielectric 108. The barrier layer 130 is deposited by a process such as physical vapor deposition (PVD), chemical vapor deposition (CVD), ion-metal plasma (IMP), hollow cathode magnetron (HCM), or a combination thereof A catalytic layer 231 is deposited as a conformal layer on the barrier layer 130. The catalytic material is deposited by a conventional atomic layer epitaxy process and is selected to have good adhesion between the barrier and seed layer materials so as to provide a strong bond interface between the two. Some examples, without limitation, of catalytic materials are Group IB and VIIIB materials, such as copper, nickel, cobalt, palladium, silver, and their alloys. In the atomic layer deposition process, copper or a copper alloy is preferred.

An electroless seed layer 232 is deposited over the catalytic layer 231 by an electroless deposition process and conductive material is deposited over the seed layer 232 in an electroplating process to form the second channel 204 and the via 206. The seed layer 232 and the conductive material of the second channel 203 and the via 206 are materials which can be deposited using electroless plating as well as electroplating such as some of the Group 1B materials. In the present invention, copper is preferred.

Figure 4:
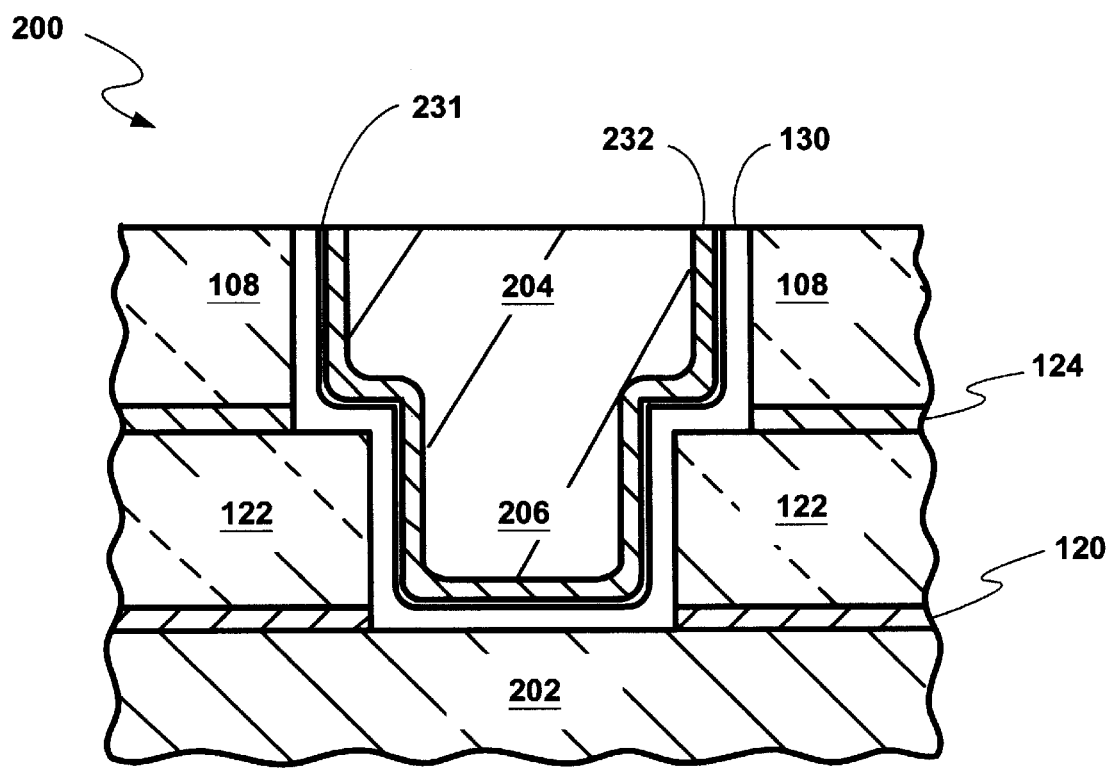
FIG. 4 is a close-up cross-section of FIG. 3 showing a completed channel and via of the present invention.

Referring now to FIG. 4, therein is shown a close-up cross-section of FIG. 3 showing the completed second channel 204 and the via 206 of the present invention. A chemical-mechanical polishing process is used to remove material above the second channel dielectric 108 to leave the barrier layer 130, the catalytic layer 231, the seed layer 232, and the second channel 204 formed in the second channel dielectric 108.

In production, the first channel 202 (shown in FIG. 1), in a first channel dielectric layer 114 above portions of a semiconductor device, is put down using a conventional first damascene process over the semiconductor wafer 200. The damascene process is a photolithographic process which uses a mask to define a first channel opening (not shown) in the first channel dielectric layer 114. The first channel dielectric layer 114 is then filled with the optional adhesion, barrier, catalytic, seed, and conductive materials. The via etch stop dielectric layer 120, the via dielectric layer 122, and the second channel dielectric layer 124 would be successively deposited on top of the first channel 202 and the first channel dielectric layer 114 using conventional deposition techniques.

By using the via photoresist and the via photolithographic process followed by etching of an opening in the via etch stop dielectric layer 120, the basis for the via 206 is formed. The subsequent deposition of the second channel dielectric layer 110 prepares the way for the second channel 204 to be perpendicular to the first channel 202.

The second damascene process is also a photolithographic process which uses a mask to define the opening 108 (shown in FIG. 1) in the second channel dielectric layer 110. Since the second damascene process uses an anisotropic etch, the etch also forms an opening for the via 206 down to the via etch stop dielectric layer 120. The anisotropic etch etches faster in the vertical direction of FIG. 3 than in the horizontal direction. The etch of the via etch stop dielectric layer 120 exposes a portion of the first channel 202 and completes the etching steps.

Thereafter, the barrier layer 130 is deposited on the second channel dielectric layer 110 and the via dielectric layer 122 by a deposition process, such as sputtering, physical vapor deposition, or chemical vapor deposition. The barrier layer 130 bonds to the via dielectric layer 122 and to the second channel dielectric layer 110 either directly or through an optional adhesive layer.

The conventional atomic layer epitaxy process is then used to deposit the catalytic layer 231 in direct contact to conform to and bond with the barrier layer 130. In the preferred embodiment, the catalytic layer 231 will be deposited in an atomic thickness below 100 Å. In some areas the catalytic layer 231 can form islands having an atomic thickness between 1.5 Å and 100 Å without severely adversely affecting the bonding of the barrier layer 130 to the seed layer 232. By comparison, the thickness of the barrier layer 130 would be from 70 Å to 300 Å, the seed layer 232 would be from 300 Å to 1200 Å thick, and the electroplated conductive material would be 4000 Å to 8000 Å thick.

Where the barrier layer 130 (for example, tungsten nitride (WN)) is deposited using chemical vapor deposition, the atomic layer epitaxy of the catalytic layer 231 (for example copper (CU)) can be performed in-situ in the same chamber of the processing equipment without the need to transfer the substrate from the vacuum to another type of processing chamber which simplifies and speeds up the process.

The semiconductor wafer 200 is then placed in an electroless plating bath and the seed layer 232 is deposited in direct contact to bond with the catalytic layer 231. Subsequently, when the desired thickness of seed material is deposited, the semiconductor wafer 200 is placed in an electroplating bath and the fill of the second channel 204 is completed by the deposition of the conductive material.

The semiconductor wafer 200 is then subject to chemical mechanical polishing to form the structure of FIG. 4 which is ready for additional levels of interconnect if desired.

While the best mode utilizes copper as the conductive material, it should be understood that the present invention is applicable to other conductive materials such as copper-base alloys, gold, gold-base alloys, silver, silver-base alloys, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as gold, copper, or silver may be used to practice the present invention. In addition, while the embodiments of the present inventions form a barrier layer in a channel opening and a via opening atop another conductive channel, it should be understood that the present invention is applicable to barrier/adhesion layers in a channel openings and/or a via openings atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor comprising:
    a semiconductor substrate;
    a dielectric layer formed on a region of the semiconductor substrate;
    an opening in the dielectric layer, the opening defined by walls of the dielectric layer and exposing a conductive area in the semiconductor;
    a barrier layer over the dielectric layer in the opening, including along the walls, and in conductive contact with the conductive area;
    a catalytic layer having an atomic thickness, the catalytic layer over and bonded to the barrier layer
    a seed layer of conductive material over and bonded to the catalytic layer; and
    a conductive layer in over the seed layer and bonded to the seed layer; the conductive layer substantially filling the opening.

2. The semiconductor as claimed in claim 1 wherein the catalytic layer has an atomic thickness below 100 Å.

3. The semiconductor as claimed in claim 1 wherein the catalytic layer is a plurality of islands having atomic thicknesses between 1.5 and 100 Å.

4. The semiconductor as claimed in claim 1 wherein the catalytic layer contains a material selected from a group consisting of Group IB and VIIIB materials.

5. The semiconductor as claimed in claim 1 wherein the barrier layer contains a material selected from a group consisting of Group IVB, VB, and VIB materials.

6. The semiconductor as claimed in claim 1 wherein the seed layer contains a Group IB material.

7. A semiconductor comprising:
    a semiconductor substrate;
    a dielectric layer formed on a region of the semiconductor substrate;
    an opening in the dielectric layer, the opening defined by walls of the dielectric layer and exposing a conductive area in the semiconductor;
    a barrier layer in direct contact with and bonded to the dielectric layer in the opening, including along the walls, and in conductive contact with the conductive area;
    a catalytic layer having an atomic thickness deposited by atomic layer epitaxy, the catalytic layer over and bonded to the barrier layer
    a seed layer of conductive material over and bonded to the catalytic layer; and
    a conductive layer in direct contact with and bonded to the seed layer, the conductive layer substantially filling the opening.

8. The semiconductor as claimed in claim 7 wherein the catalytic layer has an atomic thickness below 100 Å.

9. The semiconductor as claimed in claim 7 wherein the catalytic layer is a plurality of islands having atomic thicknesses between 1.5 and 100 Å.

10. The semiconductor as claimed in claim 7 wherein the catalytic layer contains a material selected from a group consisting of copper, nickel, cobalt, palladium, compounds thereof, and combinations thereof.

11. The semiconductor as claimed in claim 7 wherein the barrier layer contains a material selected from a group consisting of titanium, tantalum, tungsten, their nitrides, compounds thereof, and combinations thereof.

12. The semiconductor as claimed in claim 7 wherein the seed layer contains a material selected from a group consisting of copper-base alloys, gold, gold-base alloys, silver, silver-base alloys, and combinations thereof.

* * * * *

UNITED STATES PATENT AND TRADEMARK OFFICE
CERTIFICATE OF CORRECTION

PATENT NO.    : 6,479,902 B1
DATED         : November 12, 2002
INVENTOR(S)   : Lopatin et al.

It is certified that error appears in the above-identified patent and that said Letters Patent is hereby corrected as shown below:

<u>Title page,</u>
Item [73], Assignee, add -- Genus, Inc.
    Sunnyvale, CA (US) --

Signed and Sealed this

Twenty-second Day of April, 2003

JAMES E. ROGAN
*Director of the United States Patent and Trademark Office*